(12) United States Patent
Park

(10) Patent No.: US 8,872,300 B2
(45) Date of Patent: Oct. 28, 2014

(54) LIGHT EMITTING DEVICE MODULE

(75) Inventor: Hyunghwa Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 307 days.

(21) Appl. No.: 13/080,789

(22) Filed: Apr. 6, 2011

(65) Prior Publication Data

US 2011/0249455 A1    Oct. 13, 2011

(30) Foreign Application Priority Data

Apr. 7, 2010   (KR) .................. 10-2010-0031988

(51) Int. Cl.
  *H05K 1/11*    (2006.01)
  *H05K 1/02*    (2006.01)

(52) U.S. Cl.
  CPC .............. *H05K 1/111* (2013.01); *H05K 1/0209* (2013.01); *H05K 1/0204* (2013.01)
  USPC 257/459; 257/774; 257/E21.59; 257/E23.015

(58) Field of Classification Search
  CPC ............................ H05K 1/0224; H05K 1/113
  See application file for complete search history.

(56) References Cited

U.S. PATENT DOCUMENTS

| | | | |
|---|---|---|---|
| 2003/0029637 A1* | 2/2003 | Barcley | 174/262 |
| 2005/0241758 A1 | 11/2005 | Kim et al. | 156/308.2 |
| 2006/0090933 A1* | 5/2006 | Wig et al. | 174/262 |
| 2007/0284727 A1* | 12/2007 | Liao et al. | 257/700 |
| 2008/0080356 A1 | 4/2008 | Sekine et al. | 369/112.23 |
| 2009/0303426 A1 | 12/2009 | Kim | 349/150 |
| 2009/0321750 A1 | 12/2009 | Namioka | 257/81 |
| 2010/0231131 A1* | 9/2010 | Anderson | 315/152 |

FOREIGN PATENT DOCUMENTS

KR    1020070021658    * 10/2008

\* cited by examiner

*Primary Examiner* — Julio J Maldonado
*Assistant Examiner* — Mohammad Choudhry
(74) *Attorney, Agent, or Firm* — KED & Associates, LLP

(57) ABSTRACT

A light emitting device module is provided comprising a light emitting device package and a board including first and second dummy pads and an electrode pad arranged between the first and second dummy pads, on which the light emitting device package is disposed, wherein at least one of the first and second dummy pads has a dummy hole, and wherein the electrode pad adjacent to at least one of the first and second dummy pads has an electrode hole.

20 Claims, 10 Drawing Sheets

LIGHT EMITTING DEVICE MODULE

CROSS-REFERENCE TO RELATED APPLICATION

This application claims the priority benefit of Korean Patent Application No. 10-2010-0031988, filed on Apr. 7, 2010 in the Korean Intellectual Property Office, the disclosure of which is incorporated herein by reference.

BACKGROUND OF THE EMBODIMENT

1. Technical Field

Embodiments are directed to a light emitting device module, and more specifically to a light emitting device module that includes a light emitting device package and a printed circuit board, wherein assures easy heat radiate of the printed circuit board on which the light emitting device package are mounted.

2. Discussion of the Related Art

In general, light emitting diodes (LEDs), as a representative example of light emitting devices, are semiconductor device functioning to convert electric energy into light. Such light emitting diodes advantageously emit less heat, have longer lifespan, faster response time, and higher stability and are more environmentally friendly than conventional light sources, such as fluorescent lights, incandescent lights, halogen lamps, and other discharge lamps. The light emitting diodes utilize chip type semiconductors differently from conventional thermal or discharge type light sources.

In the case of a light emitting device module including a printed circuit board on which light emitting device packages containing light emitting devices are mounted, measures to dissipate heat generated by the light emitting devices packages within a limited space of the printed circuit board are required.

In particular, due to the fact that the printed circuit board is typically mounted in a slim display apparatus having a limited area of vents in consideration of aesthetics, the printed circuit board has difficulty receiving a cooling device and frequently suffers from an increase in temperature because of heat generated in the display apparatus.

Recently, studies to improve heat dissipation radiation properties of a light emitting device module including a printed circuit board have been progressed.

SUMMARY OF THE EMBODIMENT

Embodiments provide a light emitting device module wherein assures easy heat radiate of the printed circuit board on which the light emitting device package are mounted.

According to an embodiment, there is provided a light emitting device module comprising a light emitting device package and a board including first and second dummy pads and an electrode pad arranged between the first and second dummy pads, on which the light emitting device package is disposed, wherein at least one of the first and second dummy pads has a dummy hole, and wherein the electrode pad adjacent to at least one of the first and second dummy pads has an electrode hole.

According to an embodiment, there is provided a light emitting device module comprising a light emitting device package and a board including first and second dummy pads and an electrode pad arranged between the first and second dummy pads, on which the light emitting device package is disposed, wherein at least one of the first and second dummy pads has a dummy hole, wherein the electrode pad adjacent to at least one of the first and second dummy pads has an electrode hole, and wherein the electrode hole partially overlaps with at least one of an upper portion and a lower portion of the dummy hole on the basis of a center axis of the dummy hole, or does not overlap with the dummy hole.

According to an embodiment, there is provided a lighting system comprising a light emitting device module including a light emitting device package to emit light upon receiving power and a board including first and second dummy pads and an electrode pad arranged between the first and second dummy pads to receive the power, on which the light emitting device package is disposed, a power control module to supply the power to the light emitting device module and a connector to electrically connect the light emitting device module and the power control module to each other, wherein at least one of the first and second dummy pads of the board has a dummy hole and, wherein the electrode pad adjacent to at least one of the first and second dummy pads has an electrode hole.

According to the embodiments, enhanced heat radiate of the board has the effect of enhancing stability and reliability of the board.

DETAILED DESCRIPTION OF THE EXEMPLARY EMBODIMENTS

Figure 1:
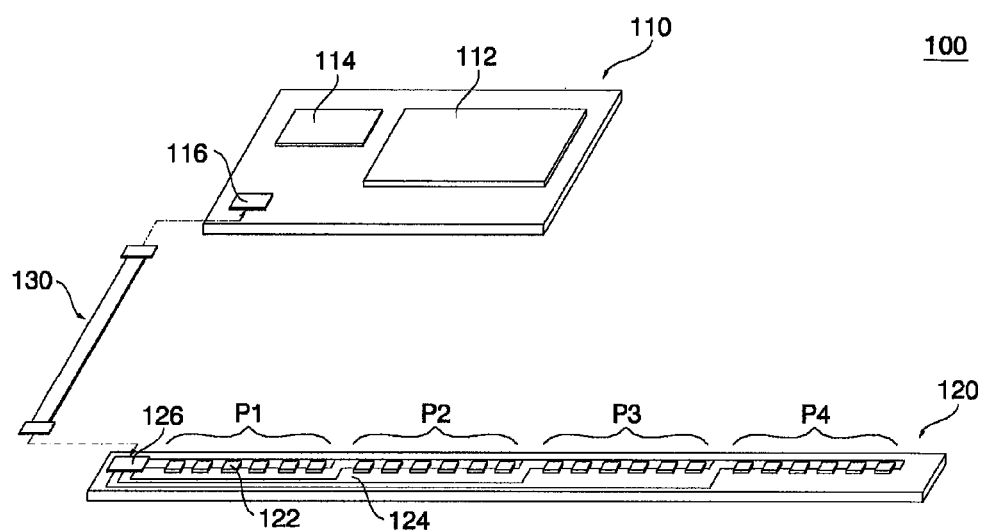
FIG. 1 is a perspective view schematically illustrating a light emitting device module according to an embodiment.

Hereinafter, embodiments will be described in detail with reference to the accompanying drawings, wherein the same reference numerals are used to denote the same or substantially the same elements throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the elements in the drawings do not thoroughly reflect real sizes of elements.

Angles and directions described herein are based on those shown in the drawings. Reference points of angles and locations of LED array structures, which are not clearly described herein, are based on those shown in the drawings.

FIG. 1 is a perspective view schematically illustrating a light emitting device module according to an embodiment.

Referring to FIG. 1, a light emitting device module 100 includes a power control module 110, a light emitting device module 120, and a connector 130.

The power control module 110 includes a power supply 112 to produce power to be supplied to a light emitting device packages 122 mounted on the light emitting device module 120, a controller 114 to control operation of the power supply 112, and a connector terminal 116 to which one end of the connector 130 is connected.

The power supply 112 is operated by control of the controller 114 to produce power to be consumed in the light emitting device module 120.

The controller 114 may function to control operation of the power supply 112 based on an externally input command.

In this case, the externally input command may be a command output from a remote controller that controls operation of an apparatus including the light emitting device module 100, or an input device (not shown) directly connected to the light emitting device module 100, the embodiments are not limited thereto.

The connector terminal 116, to which one end of the connector 130 is connected, may serve to supply the power output from the power supply 112 to the connector 130.

The light emitting device module 120 includes the light emitting device packages 122, a printed circuit board 124 on which the light emitting device packages 122 are disposed, and a connector terminal 126 to which the other end of the connector 130 is connected.

In this case, the connector terminal 126 may be electrically connected to the connector terminal 116 via the connector 130.

The connector terminal 126 will be described later in detail.

The printed circuit board 124 may be a single surface or dual surface PCB, a multi-layered PCB or may be flexible PCB.

In the embodiment, the printed circuit board 124 is referred to as the single layer PCB, although the embodiment is not limited thereto.

The plurality of the light emitting device packages 122 is described as being divided into first to fourth groups P1 to P4, and each group P1, P2, P3 and P4 is described as consisting of six light emitting device packages 122, although the number of the light emitting device packages 122 is not limited thereto.

For example, each of the first to fourth groups P1 to P4 includes six light emitting device packages 122 connected in series, and the first to fourth groups P1 to P4 may be connected in parallel to one another.

Although the embodiment describes the six light emitting device packages 122 as being connected in series to define a single group, the connection manner of the light emitting device packages 122 is not limited thereto.

Each of the first to fourth groups P1 to P4 include the same color of light emitting device packages 122, or may be configured in such a manner that at least two light emitting device packages 122 having different colors are alternately arranged.

For example, if the light emitting device module 120 is adapted to emit white light, the plurality of the light emitting device packages 122 include a light emitting device package (not shown) to emit red light and a light emitting device package (not shown) to emit blue light.

Thus, the light emitting device package to emit red light and the light emitting device package to emit blue light may be alternately arranged.

Alternatively, a light emitting device package to emit red, a light emitting device package to emit green, and a light emitting device package to emit blue light may be alternately arranged.

Figure 2:
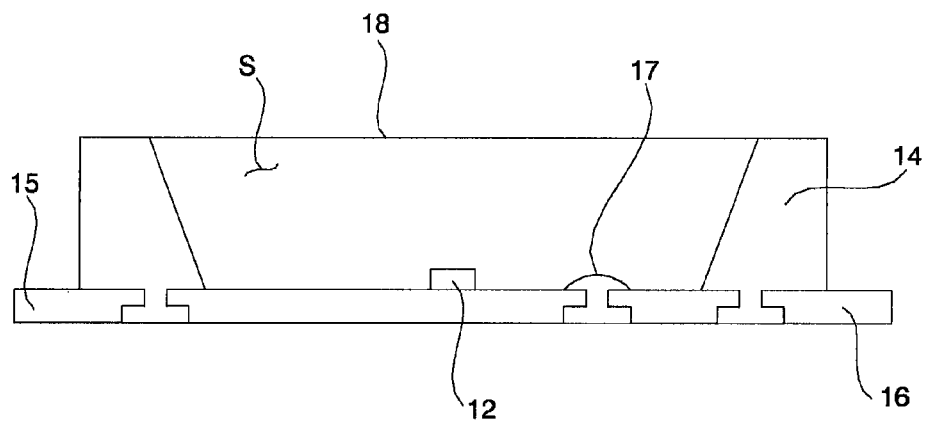
FIG. 2 is a cross-sectional view illustrating a light emitting device package according to an embodiment of FIG. 1.

FIG. 2 is a cross-sectional view illustrating a light emitting device package according to an embodiment of FIG. 1.

Referring to FIG. 2, the light emitting device package 122 includes a light emitting device 12, and a body 14 having a cavity s in which the light emitting device 12 is disposed.

The body 14 may be made of at least one selected from among a resin such as polyphthalamide (PPA), silicon (Si), aluminum (Al), aluminum nitride (AlN), aluminum oxide (AlOx), a liquid crystal polymer such as photosensitive glass (PSG), polyamide 9T (PA9T), sindiotactic polystyrene (SPS), a metal, sapphire ($Al_2O_3$), beryllium oxide (BeO), ceramic, and a Printed Circuit Board (PCB).

The body 14 may be formed by an injection molding process or an etching process, the embodiments are not limited thereto.

An upper surface of the body 14 may have various shapes, such as triangular, rectangular, polygonal and circular shapes, based on the utility and design of the light emitting device 12.

The cavity s may have a cup or container shaped cross section. Also, an inner surface of the body 14 defining the cavity s may be inclined downward.

When viewed from the front side, the cavity s may have a circular, rectangular, polygonal or elliptical shape, the embodiments are not limited thereto.

In this case, first and second lead frames 15 and 16 are provided at a lower surface of the body 14.

The first and second lead frames 15 and 16 may contain one or more metals selected from titanium (Ti), copper (Cu), nickel (Ni), gold (Au), chrome (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or alloys thereof.

The first and second lead frames 15 and 16 may have a single layer or multilayer form, the embodiments are not limited thereto.

The inner surface of the body 14 may have a predetermined inclination angle on the basis of any one of the lead frames 15 and 16.

Thus, the inner surface of the body 14 may control the reflection angle of light emitted from the light emitting device 12 based on the inclination angle thereof, thereby being capable of controlling the orientation angle of light to be emitted.

As the orientation of light decreases or increases, the convergence of the emitted light increases or decreases.

The first and second lead frames 15 and 16 may be electrically connected to the light emitting device 12, and may function to transmit power supplied from the power control module 110 to the light emitting device 12.

Here, an insulating film 17 may be interposed between the first and second frames 15 and 16 to prevent a short circuit between the first and second lead frames 15 and 16.

The light emitting device 12 may be disposed on the first lead frame 15 by die bonding and may also be bonded to the second lead frame 16 via a wire (not shown), so as to receive power from the first and second lead frames 15 and 16.

That is, the light emitting device 12 may be wire-bonded or die-bonded to each of the first and second lead frames 15 and 16, although the embodiment is not limited thereto.

The first and second lead frames 15 and 16 may be symmetrical to each other, the embodiments are not limited thereto.

The body 14 may has a cathode mark (not shown), which serves to identify polarities of the first and second lead frames 15 and 16 electrically connected to each other.

The light emitting device 12 may be a light emitting diode. The light emitting diode, for example, may be a colored light emitting diode to emit red, green, blue and white light, or an ultraviolet light emitting diode to emit ultraviolet light, although the embodiment is not limited thereto.

Alternatively, a plurality of the light emitting device 12 may be disposed on the first lead frame 15, or at least one light emitting device 12 may be disposed on each of the first and second lead frames 15 and 16.

The light emitting device 12 is not limited in terms of number and position.

The body 14 may contain a resin material 18 charged in the cavity s.

Specifically, the resin material 18 may have a dual molded structure or a triple molded structure, the embodiments are not limited thereto.

The resin material 18 may take the form of a film, and may contain at least one of a phosphor and a light diffusing agent.

Alternatively, the resin material 18 may be made of a transparent material not containing the phosphor and the light diffusing agent, although the embodiments are not limited thereto.

FIGS. 3 to 6 are partially enlarged view illustrating to embodiments with respect to a connector terminal on a printed circuit board illustrated in FIG. 1.

Figure 3:
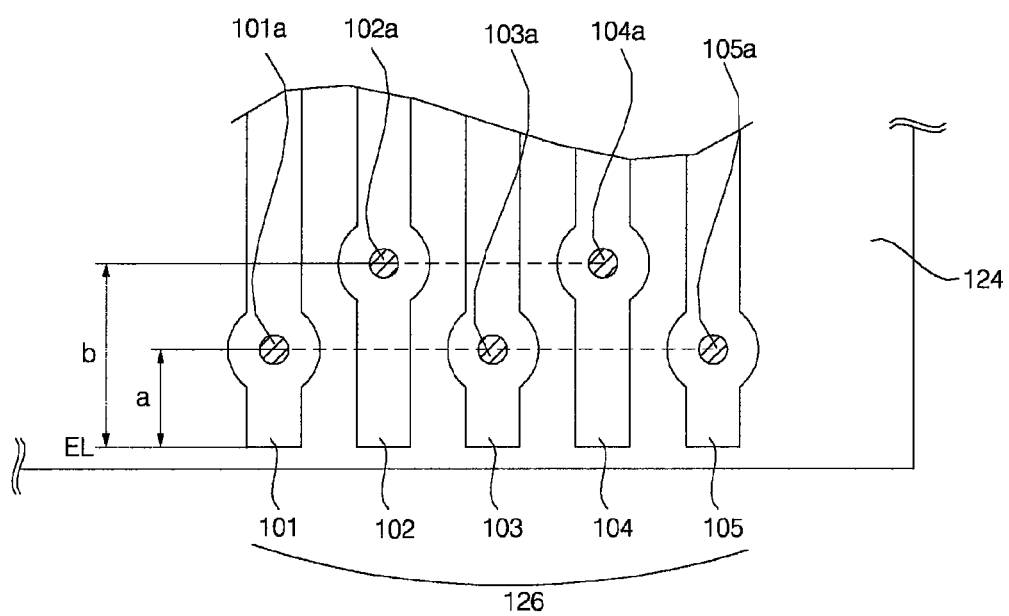
FIGS. 3 to 6 are partially enlarged view illustrating to embodiments with respect to a connector terminal on a printed circuit board illustrated in FIG. 1.

Referring to FIG. 3, the printed circuit board 124 includes the connector terminal 126 including first and second dummy pads 101 and 105 and first to third electrode pads 102 to 104 arranged between the first and second dummy pads 101 and 105.

The printed circuit board 124 may include an exposure region containing the connector terminal 126 exposed to the outside and a non-exposure region except for the exposure region, on which an insulating layer (not shown) is stacked.

The embodiment describes the connector terminal 126 as including two dummy pads and three electrode pads and the insulating layer as not being stacked over the two dummy pads.

However, the numbers of the dummy pads and the electrode pads are not limited thereto, and the insulating layer may be stacked over the two dummy pads, although the embodiment is not limited thereto.

The insulating layer may function to prevent short circuit, breakage and corrosion of the first and second dummy pads 101 and 105 and the first to third electrode pads 102 to 104.

In the embodiment, the first and second dummy pads 101 and 105 of the connector terminal 126 may be soldered with lead (Pb) or be plated with metals other than lead (Pb) for heat radiation.

The method of partially cutting out the insulating layer and soldering or plating the dummy pads may be applied throughout the specification and hereinafter, a repeated description thereof will be omitted.

The first and second dummy pads 101 and 105 may be located at opposite sides of the first to third electrode pads 102 to 104 to prevent the first to third electrode pads 102 to 104 from being damaged upon receiving external force.

The first and second dummy pads 101 and 105 serve to minimize damage to the first to third electrode pads 102 to 104 due to external force.

In the embodiment, the first and second dummy pads 101 and 105 may has first and second dummy holes 101a and 105a to increase a heat radiation area.

The first and second dummy holes 101a and 105a may function to effectively dissipate heat transferred from the light emitting device packages 122 and the printed circuit board 124.

The first dummy hole 101a formed in the first dummy pad 101 may be spaced apart from a longitudinal end EL of the pad 101 by a first length a.

The first electrode pad 102 adjacent to the first dummy pad 101 may has a first electrode hole 102a at a position spaced apart from a longitudinal end EL thereof by a second length b.

And the first length a is less than the second length b.

With this configuration, an outer circumferential surface of the first dummy hole 101a formed in the first dummy pad 101 may do not come into contact with an outer circumferential surface of the first electrode hole 102a formed in the first electrode pad 102.

Also, an outer circumferential surface of the second dummy hole 105a formed in the second dummy pad 105 may do not come into contact with an outer circumferential surface of a third electrode hole 104a formed in the third electrode pad 104.

In this case, a second electrode hole 103a formed in the second electrode pad 103 may be spaced apart from a longitudinal end EL of the pad 103 by the first length a, and an outer circumferential surface of the second electrode hole 103a may do not come into contact with the outer circumferential surfaces of the electrode holes 102a and 104a of the adjacent first and third electrode pads 102 and 104.

As the first and second dummy holes 101a and 105a and the first to third electrode holes 102a to 104a are alternately arranged at the first and second lengths a and b from the longitudinal ends, it is possible to prevent electric contact between the respective holes.

The embodiment describes the first to third electrode holes 102a to 104a as being alternately arranged at the first and second lengths a and b.

However, any one of the first to third electrode holes 102a to 104a may be arranged at a third length (not shown) different from the first and second lengths a and b, although the embodiment is not limited thereto.

The first and second dummy holes 101a and 105a and the first to third electrode holes 102a to 104a may take the form of via-holes or through-holes perforated in the printed circuit board 124.

For example, if the first and second dummy holes 101a and 105a and the first to third electrode holes 102a to 104a take the form of via-holes, a thin metal film may be formed on the outer circumferential surface of each hole, which results in more efficient heat radiation of the printed circuit board 124.

Figure 4:
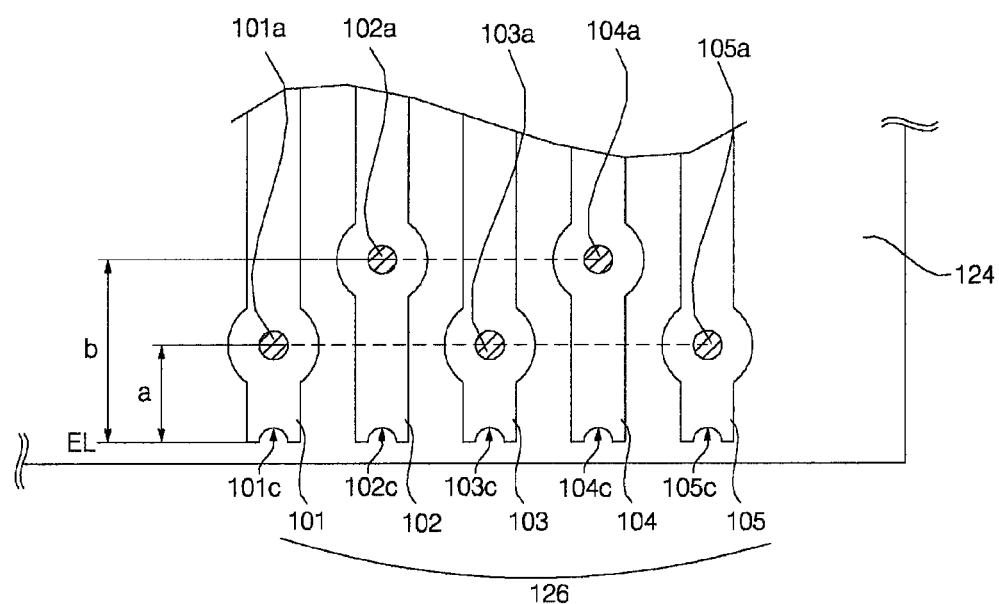

Referring to FIG. 4, the first and second dummy pads 101 and 105 and the first to third electrode pads 102 to 104 included in the connector terminal 126 may be provided at longitudinal end surfaces thereof with C-shaped recesses 101c to 105c.

In FIG. 4, a repeated description of the first and second dummy holes 101a and 105a and the first to third electrode holes 102a to 104a of FIG. 3 will be omitted.

The C-shaped recesses 101a to 105c serve to increase the area of the longitudinal end surface of each of the first and second dummy pads 101 and 105 and the first to third electrode pads 102 to 104, thereby allowing efficient heat radiation from the longitudinal end surface.

Figure 5:
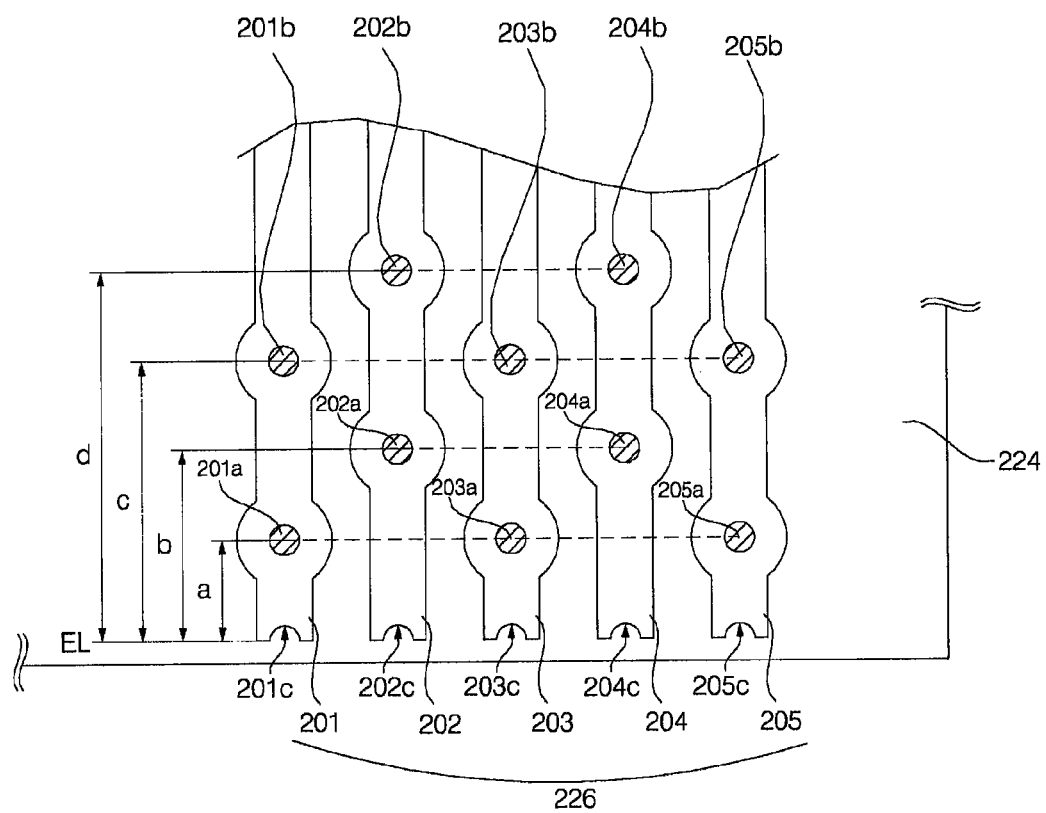

In FIG. 5, repeated configurations of FIGS. 3 and 4 will not be described or will be briefly described.

Referring to FIG. 5, a printed circuit board 224 may include a connector terminal 226, which includes first and second dummy pads 201 and 205 and first to third electrode pads 202 to 204 arranged between the first and second dummy pads 201 and 205.

The first dummy pad 201 may has first and second dummy holes 201a and 201b, and the second dummy pad 205 may be provided with third and fourth dummy holes 205a and 205b.

In this case, the first and third dummy holes 201a and 205a may be spaced apart from longitudinal ends EL of the respective pads 201 and 205 by a first length a, and the second and fourth dummy holes 201b and 205b may be spaced apart from the longitudinal ends EL by a third length c.

The embodiment describes the first and third dummy holes 201a and 205a as being spaced apart from the longitudinal ends EL by the first length a and the second and fourth dummy holes 201b and 205b as being spaced apart from the longitudinal ends EL by the third length c. However, the first and third dummy holes 201a and 205a or the second and fourth dummy holes 201b and 205b may be located at different positions, although the embodiment is not limited thereto.

The first electrode pad 202 may be provided with first and second electrode holes 202a and 202b, the second electrode pad 203 may has third and fourth electrode holes 203a and 203b, and the third electrode pad 204 may be provided with fifth and sixth electrode holes 204a and 204b.

In this case, the first and fifth electrode holes 202a and 204a may be spaced apart from longitudinal ends EL of the respective pads 202 and 204 by a second length b, the second and sixth electrode holes 202b and 204b may be spaced apart from the longitudinal ends EL by a fourth length d, and the third and fourth electrode holes 203a and 203b may be spaced apart from a longitudinal ends EL of the pad 203 by the first and third lengths a and c respectively.

Here, although the first and fifth electrode holes 202a and 204a or the second and sixth electrode holes 202b and 204b are spaced apart from the longitudinal ends EL by the same distance, the embodiment is not limited thereto.

Although the embodiment describes the first and second dummy pads 201 and 205 and the first to third electrode pads 202 to 204 as having the two dummy holes and the two electrode holes respectively, the number of the holes is not limited thereto. Also, the dummy holes and the electrode holes may be alternately arranged, and has different hole shape, although the embodiment is not limited thereto.

Alternatively, each of the first and second dummy pads 201 and 205 may have a single dummy hole, each of the first to third electrode pads 202 to 204 may have two electrode holes, and the dummy hole may be located between the two electrode holes, although the embodiment is not limited thereto.

Figure 6:
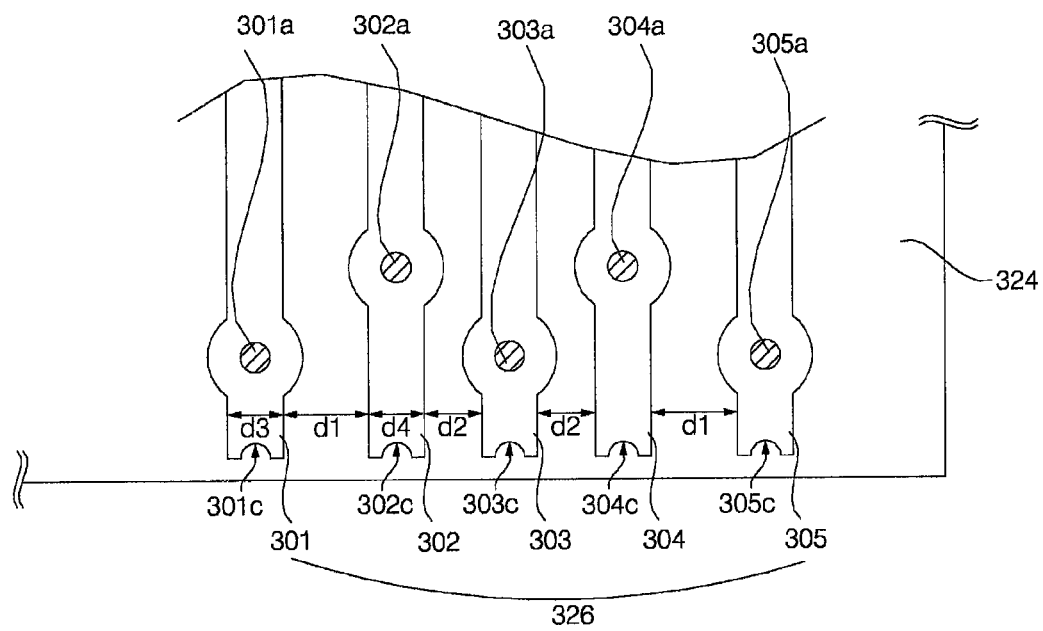

In FIG. 6, repeated configurations of FIGS. 3 to 5 will not be described or will be briefly described.

Referring to FIG. 6, a printed circuit board 324 includes a connector terminal 326, which includes first and second dummy pads 301 and 305 and first to third electrode pads 302 to 304 arranged between the first and second dummy pads 301 and 305.

The first dummy pad 301 may has a first dummy hole 301a, and the second dummy pad 305 may has a second dummy hole 305a.

The first electrode pad 302 may be provided with a first electrode hole 302a, the second electrode pad 303 may has a second electrode hole 303a, and the third electrode pad 304 may has a third electrode hole 303a.

In the embodiment, the first and second dummy holes 301 and 305a and the first to third electrode holes 302a, 303a and 304a are identical to those of FIGS. 3 to 5 and thus, a repeated description thereof will be omitted.

In this case, the first dummy pad 301 may be spaced apart from the adjacent first electrode pad 302 by a first distance d1, the first electrode pad 302 may be spaced apart from the adjacent second electrode pad 303 by a second distance d2, and the second electrode pad 303 may be spaced apart from the adjacent third electrode pad 304 by the second distance d2.

The first and second dummy pads 301 and 305 may have the same width d3, and the first to third electrode pads 302 to 304 may have the same width d4, which is less than the width d3.

When the width d3 of the first and second dummy pads 301 and 305 is greater than the width d4 of the first to third electrode pads 302 to 304 and the first distance d1 between the first dummy pad 301 and the first electrode pad 302 is greater than the second distance d2 between the first and second electrode pads 302 and 303, it is possible to prevent damage to the first to third electrode pads 302 to 304 due to external force and to achieve enhanced heat radiation efficiency.

The first and second dummy pads 301 and 305 and the third to third electrode pads 302 to 304 may has at longitudinal end surfaces thereof with C-shaped recesses 301c to 305c respectively.

Although the embodiment describes the dummy hole and the electrode hole as not overlapping each other, a portion of the dummy hole may overlap with a portion of the electrode hole.

Specifically, the electrode hole may partially overlap with at least one of an upper portion and a lower portion of the dummy hole on the basis of a center axis of the dummy hole, although the embodiment is not limited thereto.

FIGS. 7 to 10 are view illustrating a light emitting device module according to embodiments.

Figure 7:
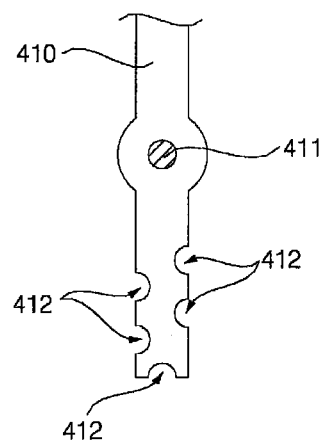
FIGS. 7 to 10 are view illustrating a light emitting device module according to embodiments.

In FIGS. 7 to 10, repeated configurations of FIGS. 3 to 6 will not be described or will be briefly described. The pad illustrated in FIG. 7 is at least one of the dummy pad and the electrode pad.

Referring to FIG. 7, a pad 410 may be provided at a longitudinal end surface and a lateral surface thereof with C-shaped recesses 412.

Here, the C-shaped recesses 412 may be formed at the longitudinal end surface and/or the lateral surface of the pad 410, to increase the exposure area of the longitudinal end surface or the lateral surface, thereby enhancing radiation of heat generated by the pad 410.

The pad 410 may has at least one hole 411 and heat generated by the pad 410 may be dissipated to the outside air through an inner circumferential surface of the hole 411.

In this case, a thin metal film may be formed on the inner circumferential surface of the hole 411 to enhance heat radiation efficiency.

In addition, the pad 410 may be subjected to soldering or plating using lead (Pb), silver (Ag) and various other metals.

Figure 8:
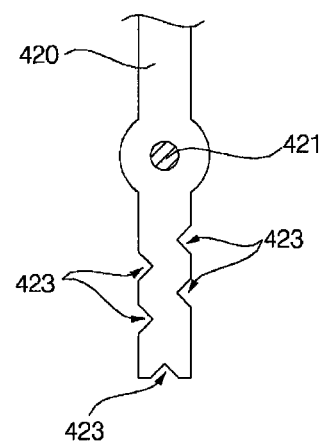

Referring to FIG. 8, V-shaped recesses 423 may be formed at a longitudinal end surface and a lateral surface of a pad 420.

Similar to the C-shaped recess 412 illustrated in FIG. 7, the V-shaped recess 423 may serve to increase the exposure area of the longitudinal end surface or the lateral surface, which results in enhanced heat radiation efficiency.

Figure 9:
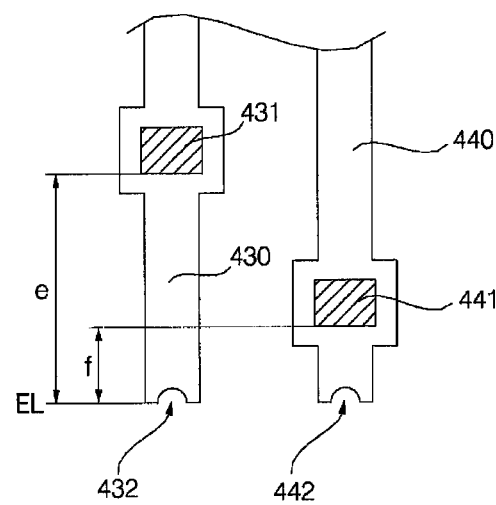

Referring to FIG. 9, first and second pads 430 and 440 each having a rectangular hole may be arranged next to each other.

Specifically, the first pad 430 may be a dummy pad and the second pad 440 may be an electrode pad. Alternatively, both the first and second pads 430 and 440 may be electrode pads, although the embodiment is not limited thereto.

The first and second pads 430 and 440 may be spaced apart from each other by a minimum distance, and may be provided with first and second rectangular holes 431 and 441 to enhance heat radiation efficiency.

The first hole 431 may be spaced apart from a longitudinal end EL of the pad 430 by a fifth length e, and the second hole 441 may be spaced apart from a longitudinal end EL of the pad 440 by a sixth length f.

In this case, the fifth and sixth lengths e and f may differ from each other, and the first and second holes 431 and 441 may be arranged so as not to partially overlap each other.

Figure 10:
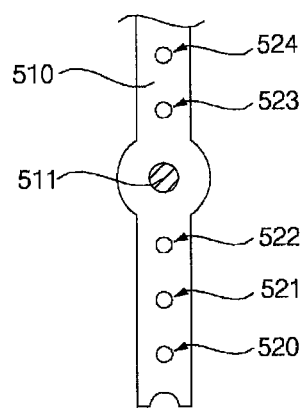

Referring to FIG. 10, a pad 510 may be provided with a hole 511 and a plurality of through-holes 520 to 524 arranged above and below the hole 511.

The plurality of through-holes 520 to 524 may penetrate the pad 510, such that heat generated by the pad 510 can be dissipated using air passing through the through-holes 520 to 524. That is, the through-holes 520 to 524 may serve as heat radiation holes.

If a thin metal film is formed on an inner circumferential surface of each of the plurality of through-holes 520 to 524, the through-holes 520 to 524 may function as via-holes to electrically connect front and rear surfaces of a printed circuit board (not shown) to each other. Also, heat radiation efficiency may be enhanced in proportion to the area of the thin metal film.

In the pads illustrated in FIGS. 7 to 10, the shape a peripheral region around the hole may be changed according to the shape of the hole, although the embodiment is not limited thereto.

Figure 11:
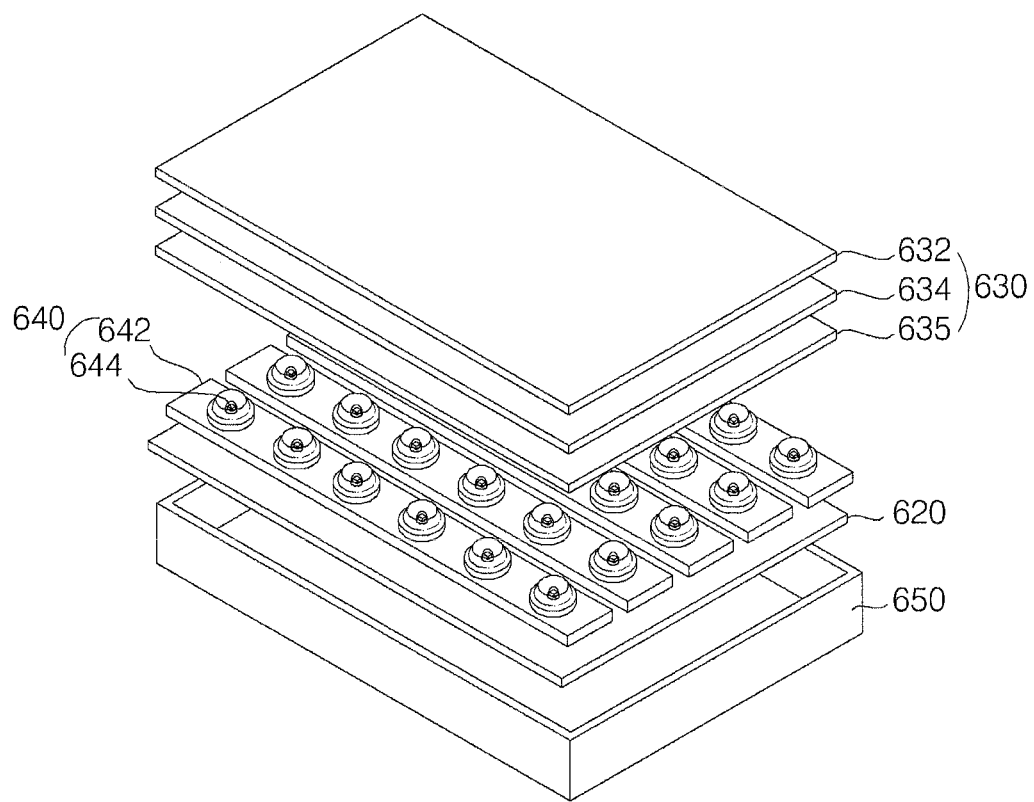
FIG. 11 is a perspective view illustrating a backlight unit including a light emitting device module according to an embodiment.

FIG. 11 is a perspective view illustrating a backlight unit including a light emitting device module according to an embodiment.

Referring to FIG. 11, the backlight unit includes a lower receiving member 650, a reflecting plate 620, a plurality of light emitting device modules 640, and a plurality of optical sheets 630.

In this case, each of the light emitting device modules 640 may include a printed circuit board 642 on which a plurality of light emitting device packages 644 may be easily mounted.

Each of the light emitting device package 644 may be provided at a bottom surface thereof with a plurality of bosses, which may improve color mixing effects of red light, green light and blue light when the light emitting device packages 644 are adapted to emit red (R), green (G), and blue (B) light.

Of course, even when the light emitting device packages 644 are adapted to emit only white light, the bosses formed at the bottom surface of the light emitting device packages 644 may assure uniform light distribution and emission.

The reflecting plate 620 may be made of a high reflectivity material to reduce light loss. The optical sheets 630 may include at least one of a brightness enhancing sheet 632, a prismatic sheet 634, and a diffusive sheet 635.

The diffusive sheet 635 may serve to diffuse light emitted from the light emitting device module 640 to provide the light with uniform brightness distribution over a wide range while directing the light toward a liquid crystal display panel (not shown).

The prismatic sheet 634 serves to vertically direct light obliquely incident thereon.

Specifically, to vertically direct the light having passed through the diffusive sheet 635, at least one prismatic sheet 634 may be disposed below the liquid crystal display panel (not shown).

The brightness enhancing sheet 632 serves to transmit light parallel to a transmission axis thereof while reflecting light perpendicular to the transmission axis.

Figure 12:
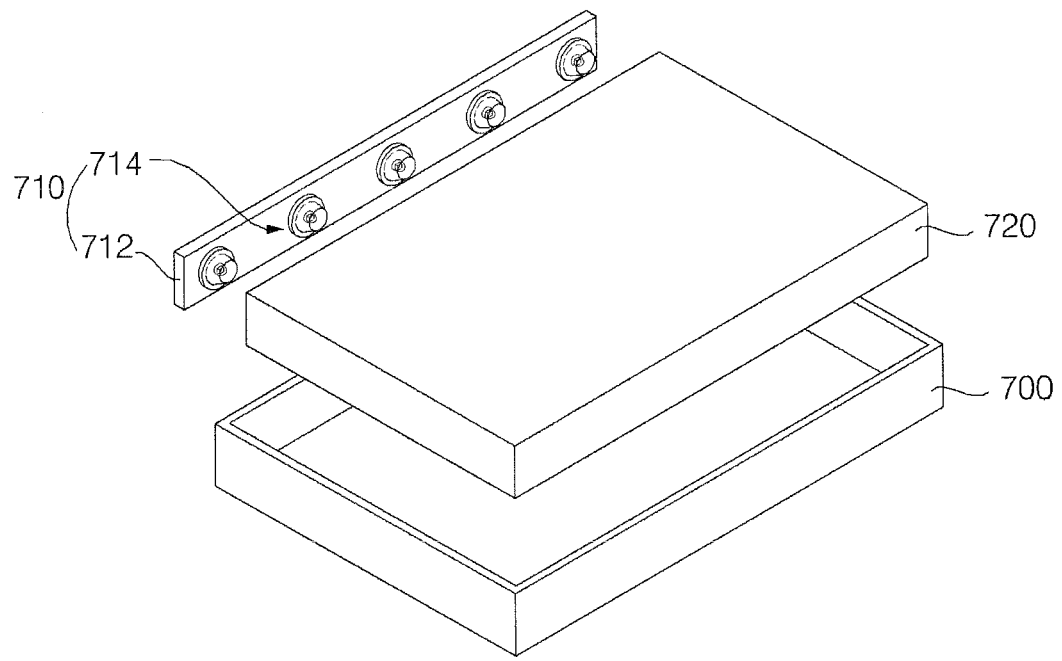
FIG. 12 is a perspective view illustrating a backlight unit including a light emitting device module according to an embodiment.

FIG. 12 is a perspective view illustrating a backlight unit including a light emitting device module according to an embodiment.

Referring to FIG. 12, the backlight unit may include a lower receiving member 700, a light emitting device module 710 to emit light, a light guide plate 720 arranged adjacent to the light emitting device module 710, and a plurality of optical sheets (not shown).

The plurality of optical sheets (not shown) may be located on the light guide plate 720.

Hereinafter, a detailed description of the optical sheets (not shown) will be omitted because it is identical to that of the plurality of optical sheets 630 as described above in relation to FIG. 11.

The light emitting device module 710 may include a plurality of light emitting device packages 714 disposed on a printed circuit board 712.

The printed circuit board 712 may be selected from among a Metal Core Printed Circuit Board (MCPCB), a Flame Retardant composition 4 (FR-4) PCB, and various other PCBs. In addition, the printed circuit board 712 may have a rectangular plate shape, or various other shapes depending on the configuration of a backlight assembly.

The light guide plate 720 converts the light emitted from the light emitting device module 710 into planar light to thereby direct the light to a liquid crystal display panel (not shown).

A plurality of optical films (not shown), which serve to realize uniform brightness distribution and enhanced vertical incidence of light directed from the light guide plate 720, and a reflecting sheet (not shown), which reflects light having passed through a rear surface of the light guide plate 720 toward the light guide plate 720, may be located at the rear surface of the light guide plate 720.

It will be appreciated that the configuration of the edge type backlight unit illustrated and described in FIG. 12 and the configuration of the vertical type backlight unit illustrated and described in FIG. 11 may be combined as occasion demands.

Figure 13:
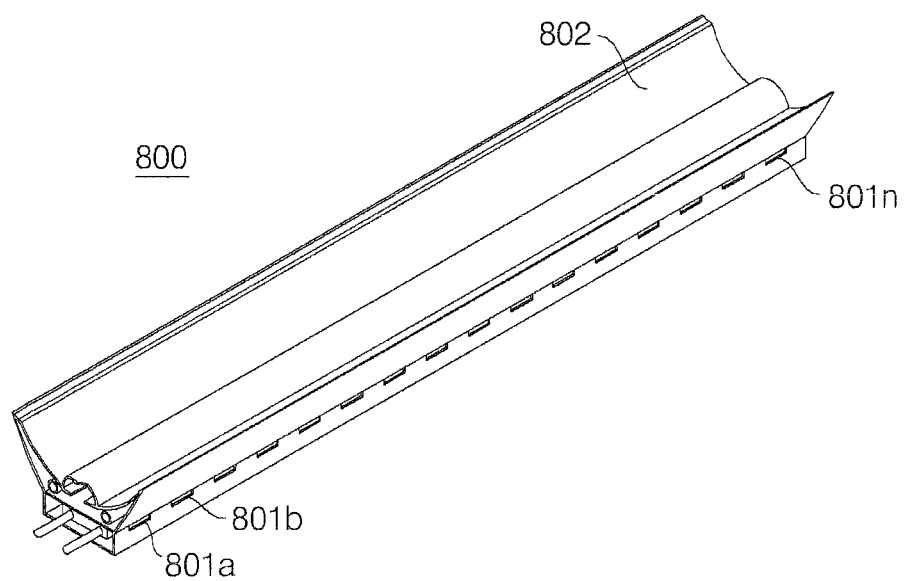
FIG. 13 is a perspective view illustrating a lighting apparatus including a light emitting device module according to an embodiment.

FIG. 13 is a perspective view illustrating a lighting apparatus including a light emitting device module according to an embodiment.

Referring to FIG. 13, the lighting apparatus 800 includes a lampshade 802 and light emitting device packages 801a to 801n arranged at a surface of the lampshade 802. Although not illustrated in the drawing, a power device is provided to supply power to the respective light emitting device packages 801 to 801n. Differently from conventional light emitting devices, the light emitting device package in accordance with the present embodiment is free from light absorption by an electrostatic discharge (ESD) device (or, element), such as a Zener diode, thereby outputting an increased quantity of light.

Although FIG. 13 illustrates a fluorescent light type lampshade, of course, the light emitting device in accordance with the embodiment may be applied to a general spiral bulb type, a Fluorescent Parallel Lamp (FPL) type, a halogen lamp type, a metal lamp type and various other types and socket standards, although the embodiment is not limited thereto.

Here, the lighting apparatus and the backlight unit illustrated in FIGS. 11 to 13 may be included in a lighting system, and other lighting-oriented apparatuses including the above described light emitting device module may be included in the lighting system, although the embodiment is not limited thereto.

As is apparent from the above description, in accordance with the embodiment, as a result of providing a dummy pad and an electrode pad with a dummy hole and an electrode hole, it is possible to enhance radiation of heat generated by a light emitting device package mounted on a printed circuit board.

Further, according to the embodiment, enhanced heat radiation of the printed circuit board has the effect of enhancing stability and reliability of the printed circuit board.

The embodiment has been explained above with reference to characteristic. It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiments usefulness is not limited thereto and that the embodiment can be beneficially utilized in any number of environments and implementations. The foregoing description and drawings are, accordingly, to be regarded in an illustrative rather than a restrictive sense.

What is claimed is:

1. A light emitting device module comprising:
   a light emitting device package; and
   a board including first and second dummy pads and an electrode pad arranged between the first and second dummy pads, on which the light emitting device package is disposed,
   wherein at least one of the first and second dummy pads has a dummy hole,
   wherein the electrode pad adjacent to at least one of the first and second dummy pads has an electrode hole,
   wherein the first and second dummy pads having a first length spaced apart from longitudinal ends,
   wherein the electrode pad includes a first electrode pad, a second electrode pad and a third electrode pad adjacent one another,
   wherein the first electrode pad has a first electrode hole at the first length from a longitudinal end of the first electrode pad,
   wherein the second electrode pad has a second electrode hole at a second length from a longitudinal end of the second electrode pad,
   wherein the third electrode pad has a third electrode hole at the first length from a longitudinal end of the third electrode pad, and
   wherein the first and second dummy holes and the first to third electrode holes are alternately arranged.

2. The light emitting device module of claim 1, wherein a length of the dummy hole is at a first length from a longitudinal end, wherein a length of the electrode hole is at a first length from a longitudinal end.

3. The light emitting device module of claim 1, wherein a width of the first dummy pad is greater than a width of the electrode pad.

4. The light emitting device module of claim 1 wherein a width of the electrode hole is equal to or greater than a width of the dummy hole.

5. The light emitting device module of claim 1, wherein at least one of the dummy hole and the electrode hole has at least one selected from the group consisting of circular, semicircular, polygonal, and other curvilinear shapes.

6. The light emitting device module of claim 1, wherein at least one of the first dummy pad and the electrode pad includes a recess formed in at least one of a lateral surface and a longitudinal end surface thereof.

7. The light emitting device module of claim 6, wherein the recess includes at least one of a V-shaped recess and a C-shaped recess.

8. The light emitting device module of claim 1, wherein at least one of the first and second dummy pads has a plurality of dummy holes.

9. The light emitting device module of claim 1, wherein the electrode pad has a plurality of electrode holes.

10. The light emitting device module of claim 1, wherein a metal is embedded in at least one of the dummy hole and the electrode hole.

11. The light emitting device module of claim 10, wherein the metal is applied to a circumferential surface of at least one of the dummy hole and the electrode hole.

12. The light emitting device module of claim 1, wherein at least one of the first and second dummy pads has a heat radiation hole having a width different from that of the dummy hole.

13. The light emitting device module of claim 1, wherein the electrode pad has a heat radiation hole having a width different from that of the electrode hole.

14. The light emitting device module of claim 1, wherein the first length of the dummy hole is less than the first length of the electrode hole.

15. The light emitting device module of claim 1, wherein:
   the electrode pad includes first and second electrode pads adjacent to each other; and
   a distance between the first dummy pad and the adjacent first electrode pad is greater than a distance between the first and second electrode pads.

16. The light emitting device module of claim 1, wherein the dummy hole has different hole shape than the electrode hole.

17. A light emitting device module comprising:
   a light emitting device package; and
   a board including first and second dummy pads and an electrode pad arranged between the first and second dummy pads, on which the light emitting device package is disposed,
   wherein at least one of the first and second dummy pads has a dummy hole,
   wherein the electrode pad adjacent to at least one of the first and second dummy pads has an electrode hole,
   wherein the electrode hole partially overlaps with at least one of an upper portion and a lower portion of the dummy hole based on a center axis of the dummy hole, or does not overlap with the dummy hole,
   wherein the first and second dummy pads having a first length spaced apart from longitudinal ends,
   wherein the electrode pad includes a first electrode pad, a second electrode pad and a third electrode pad adjacent one another,
   wherein the first electrode pad has a first electrode hole at the first length form a longitudinal end of the first electrode pad,
   wherein the second electrode pad has a second electrode hole at a second length from a longitudinal end of the second electrode pad,
   wherein the third electrode pad has a third electrode hole at the first length from a longitudinal end of the third electrode pad, and
   wherein the first and second dummy holes and the first to third electrode holes are alternately arranged.

18. A lighting system comprising:
   a light emitting device module including a light emitting device package to emit light upon receiving power and a board including first and second dummy pads and an electrode pad arranged between the first and second dummy pads to receive the power, on which the light emitting device package is disposed;

a power control module to supply the power to the light emitting device module; and a connector to electrically connect the light emitting device module and the power control module to each other, wherein at least one of the first and second dummy pads of the board has a dummy hole, wherein the electrode pad adjacent to at least one of the first and second dummy pads has an electrode hole, wherein the first and second dummy pads having a first length spaced apart form longitudinal ends, and wherein the electrode pad includes a first electrode pad, a second electrode pad and a third electrode pad adjacent one another, wherein the first electrode pad has a first electrode hole at the first length from a longitudinal end of the first electrode pad, wherein the second electrode pad has a second electrode hole at a second length from a longitudinal end of the second electrode pad, wherein the third electrode pad has a third electrode hole at the first length from a longitudinal end of the third electrode pad, and wherein the first and second dummy holes and the first to third electrode holes are alternately arranged.

19. The light emitting device module of claim 1, wherein the electrode pad has a plurality of through-holes arranged above and the below the electrode hole.

20. The lighting system of claim 18, wherein the electrode pad has a plurality of through-holes arranged above and the below the electrode hole.

* * * * *